United States Patent
Suzuki et al.

(10) Patent No.: US 8,945,413 B2
(45) Date of Patent: Feb. 3, 2015

(54) ETCHING METHOD, ETCHING APPARATUS, AND RING MEMBER

(75) Inventors: Ayuta Suzuki, Nirasaki (JP); Songyun Kang, Nirasaki (JP); Tsuyoshi Moriya, Tokyo (JP); Nobutoshi Terasawa, Nirasaki (JP); Yoshiaki Okabe, Toyama (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/554,582

(22) Filed: Jul. 20, 2012

(65) Prior Publication Data
US 2013/0186858 A1 Jul. 25, 2013

Related U.S. Application Data

(63) Continuation of application No. PCT/JP2011/050960, filed on Jan. 20, 2011.

(30) Foreign Application Priority Data

Jan. 22, 2010 (JP) ................. 2010-012407

(51) Int. Cl.
*B44C 1/22* (2006.01)
*B29C 59/14* (2006.01)
*H01J 37/32* (2006.01)
*H01L 21/3065* (2006.01)
(Continued)

(52) U.S. Cl.
CPC ............ *B29C 59/14* (2013.01); *H01J 37/32623* (2013.01); *H01J 37/32642* (2013.01);
(Continued)

(58) Field of Classification Search
CPC ...................... H01J 37/32477; H01J 37/32642; H01J 37/32467; H01L 21/67069; H01L 21/31116; H01L 21/3065; H01L 21/32136; H01L 21/68757; C23C 16/4404
See application file for complete search history.

(56) References Cited

U.S. PATENT DOCUMENTS

| | | | | |
|---|---|---|---|---|
| 5,556,500 | A * | 9/1996 | Hasegawa et al. | ........ 156/345.27 |
| 2006/0102288 | A1 | 5/2006 | Satoh et al. | |
| 2007/0204797 | A1* | 9/2007 | Fischer | ..................... 118/723 R |
| 2008/0066868 | A1* | 3/2008 | Masuda | ................... 156/345.51 |

FOREIGN PATENT DOCUMENTS

| | | |
|---|---|---|
| JP | 7-245292 | 9/1995 |
| JP | 2002-009048 | 1/2002 |

(Continued)

OTHER PUBLICATIONS

International Search Report mailed on Apr. 26, 2011, issued for International Application No. PCT/JP2011/050960, filed on Jan. 20, 2011 (with English translation).

*Primary Examiner* — Lan Vinh
*Assistant Examiner* — Jiong-Ping Lu
(74) *Attorney, Agent, or Firm* — Oblon, Spivak, McClelland, Maier & Neustadt, L.L.P.

(57) ABSTRACT

Etching is performed through the following process. A substrate is loaded into a processing chamber and mounted on a mounting table therein. Then, in the state where a ring member at least a surface of which is made of a same material as a main component of an etching target film is provided to surround the substrate, a processing gas is injected in a shower-like manner from a gas supply unit oppositely facing the substrate and the etching target film is etched by using a plasma of the processing gas; and evacuating the inside of the processing chamber through an exhaust path. Through this process, unbalanced distribution of plasma active species in the vicinity of a circumferential edge portion of the substrate can be suppressed.

14 Claims, 13 Drawing Sheets

(51) Int. Cl.
*H01L 21/311* (2006.01)
*H01L 21/3213* (2006.01)

(52) U.S. Cl.
CPC ...... *H01L21/3065* (2013.01); *H01L 21/31116* (2013.01); *H01L 21/31138* (2013.01); *H01L 21/32136* (2013.01); *Y10S 156/915* (2013.01)
USPC ........... 216/71; 216/67; 156/345.51; 156/915

(56) References Cited

FOREIGN PATENT DOCUMENTS

| | | |
|---|---|---|
| JP | 2006-140423 A | 6/2006 |
| JP | 2008-78208 A | 4/2008 |
| KR | 10-2008-0106427 | 12/2008 |

\* cited by examiner

γ = 0

γ = 0.25

γ =0.5

γ =1

ETCHING METHOD, ETCHING APPARATUS, AND RING MEMBER

This application is a Continuation Application of PCT International Application No. PCT/JP2011/050960 filed on Jan. 20, 2011, which designated the United States.

FIELD OF THE INVENTION

The present invention relates to an etching method and an etching apparatus for performing an etching process on a substrate by using a plasma converted from a processing gas and also relates to a ring member to be used in the etching method.

BACKGROUND OF THE INVENTION

In a process of forming a multilayer wiring structure of a semiconductor device, there may be performed a plasma etching process for forming a recess in a damascene structure having a hole or a via hole on various kinds of films formed on a semiconductor wafer (hereinafter, simply referred to as a "wafer") made of, e.g., silicon (Si).

An apparatus for performing the plasma etching process includes a mounting table for mounting thereon the wafer and a focus ring disposed to surround the periphery of the wafer mounted on the mounting table. The focus ring is provided to increase uniformity in a plasma distribution on a surface of the wafer. In order to achieve such high uniformity in the plasma distribution, it has been deemed to be effective that electrical characteristics such as an electric conductivity of the focus ring are made to be close to those of the wafer. For this reason, the focus ring may be made of Si, the same material as that of the wafer.

However, an etching target film exposed on the surface of the wafer may be made of various kinds of materials. If the material of the etching target film is different from the material of the focus ring, distribution of active species included in the plasma becomes non-uniform at the vicinity of a boundary between the wafer and the focus ring in comparison to the distribution of active species at a diametrically inner region of the wafer due to different reactions of the active species in the plasma depending on the materials. The present inventor has found out that as a result of this non-uniform distribution of the active species, an etching rate at an edge portion of the wafer becomes larger or smaller than an etching rate at a central portion of the wafer.

Each of Japanese Patent Application Publication No. 2006-140423 and Japanese Patent Application Publication No. 2008-78208 discloses a plasma etching apparatus having a focus ring. However, neither of them discloses the solution to solve the aforementioned problem.

SUMMARY OF THE INVENTION

In view of the above, the present invention provides a technique capable of performing a highly uniform etching process when performing a dry-etching on an etching target film formed on a substrate by using a plasma converted from a processing gas.

In accordance with one aspect of the present invention, there is provided a method of dry-etching an etching target film formed on a substrate, including: loading the substrate into a processing chamber and mounting the substrate on a mounting table in the processing chamber; injecting a processing gas in a shower-like manner from a gas supply unit oppositely facing the substrate and etching the etching target film by using a plasma of the processing gas in a state where a ring member at least a surface of which is made of a same material as a main component of the etching target film to surround the substrate; and evacuating the inside of the processing chamber through an exhaust path. The etching target film is other than a silicon film and a silicon oxide film.

In accordance with another aspect of the present invention, there is provided a method of dry-etching an etching target film formed on a substrate, including: forming, on a surface of a ring member provided to surround the substrate when the substrate is mounted on a mounting table in a processing chamber to be etched therein, a film made of a material having a same main component as that of the etching target film formed on the substrate by supplying a film forming gas to the ring member; loading the substrate into the processing chamber and mounting the substrate on the mounting table; injecting a processing gas in a shower-like manner from a gas supply unit oppositely facing the substrate and etching the etching target film by using a plasma of the processing gas in a state where the ring member is disposed to surround the substrate; and evacuating the inside of the processing chamber through an exhaust path.

In accordance with still another aspect of the present invention, there is provided a method of dry-etching an etching target film formed on a substrate, including: replacing a ring member provided to surround the substrate when the substrate is mounted on a mounting table in a processing chamber to be etched therein with a ring member at least a surface of which is made of a same material as a main component of the etching target film formed on the substrate to be etched in the processing chamber; loading the substrate into the processing chamber and mounting the substrate on the mounting table; injecting a processing gas in a shower-like manner from a gas supply unit oppositely facing the substrate and etching the etching target film by using a plasma of the processing gas in a state where the replaced ring member is disposed to surround the substrate; and evacuating the inside of the processing chamber through an exhaust path.

In accordance with still another aspect of the present invention, there is provided An apparatus for performing a dry-etching on an etching target film formed on a substrate in a vacuum atmosphere, the apparatus including: a processing chamber in which a mounting table for mounting thereon the substrate is provided; a gas supply unit disposed to oppositely face the mounting table and configured to inject a processing gas in a shower-like manner; a plasma generation unit for generating a plasma of the processing gas; a ring member provided to surround the substrate on the mounting table; an etching gas supply source configured to supply an etching gas into the gas supply unit; a film forming gas supply source configured to supply a film forming gas for forming, on a surface of the ring member, a film made of a material having a same main component as that of the etching target film formed on the substrate into the gas supply unit; and a controller configured to output a control signal so as to form the film formed on the surface of the ring member by supplying the film forming gas into the processing chamber from the film forming gas supply source via the gas supply unit before the substrate is loaded into the processing chamber.

In accordance with still another aspect of the present invention, there is provided a ring member provided to surround a substrate. The ring member is used in an etching method described above.

In accordance with the present invention, the ring member having the surface portion made of a same material as the main component of the etching target film of the substrate is disposed to surround the substrate, and the etching target film is etched by the plasma converted from the processing gas. Accordingly, unbalanced distribution of active species of the plasma between the central portion and the edge portion of the substrate can be suppressed. Hence, a highly uniform etching process can be implemented.

Figure 1:
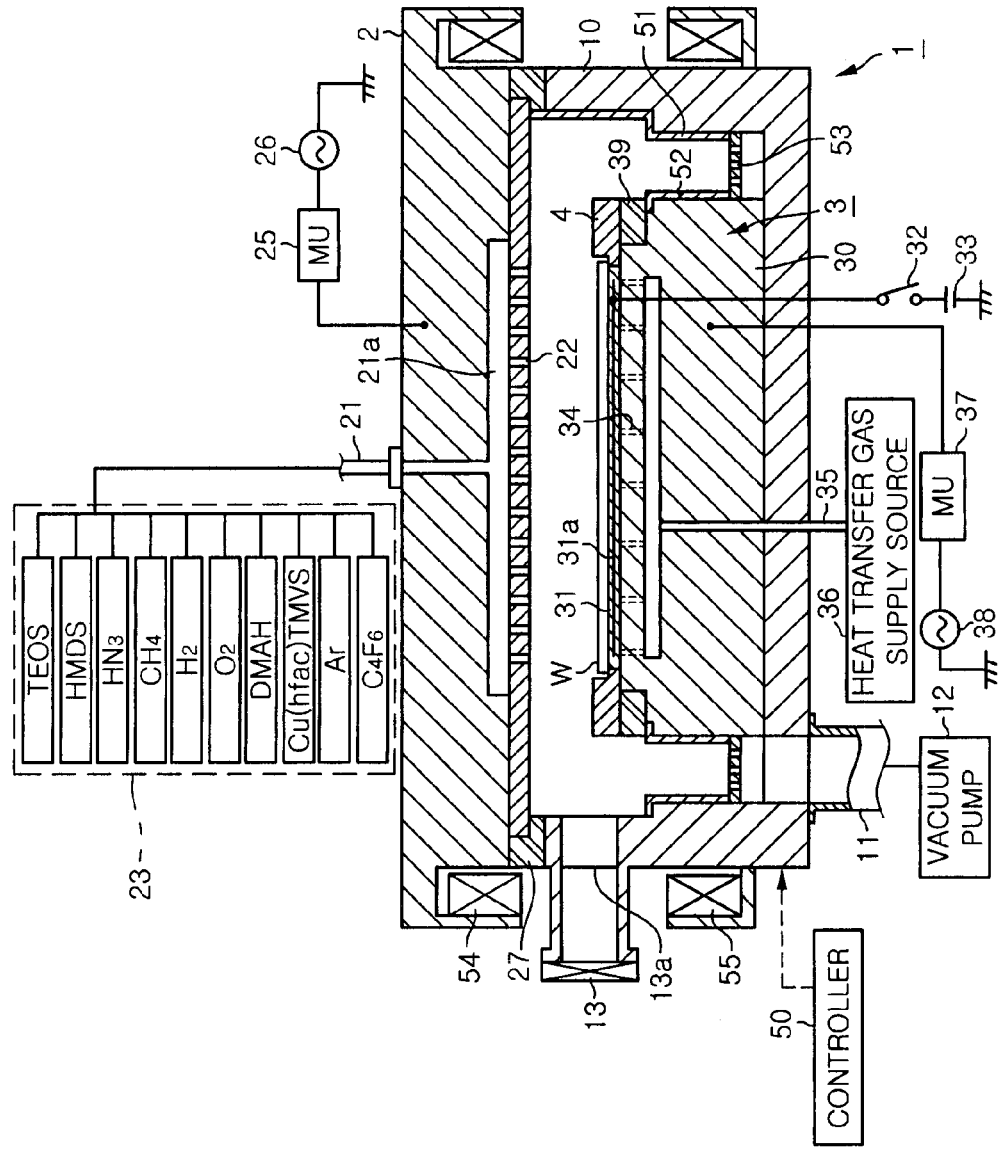
FIG. 1 is a longitudinal cross sectional side view of a plasma etching apparatus in accordance with an embodiment of the present invention.

DETAILED DESCRIPTION OF THE EMBODIMENTS (First Embodiment)

Hereinafter, a plasma etching apparatus 1 in accordance with an embodiment of the present invention will be described. The plasma etching apparatus 1 is configured as a magnetron reactive ion etching apparatus. A reference numeral 10 denotes a hermetically sealed processing chamber formed of, e.g., a conductive material such as aluminum. The processing chamber 10 is grounded. In the processing chamber 10, an upper electrode 2 and a mounting table 3 serving as a lower electrode are provided so as to oppositely face each other. The upper electrode 2 serves as a gas shower head, which is a gas supply unit for introducing a processing gas for etching (etching gas). A wafer W used as a substrate and formed of silicon is mounted on the mounting table 3.

An exhaust pipe 11 is connected at a bottom portion of the processing chamber 10. A vacuum exhaust device, e.g., a vacuum pump 12 such as a turbo molecular pump or a dry pump is connected to the exhaust pipe 11. Further, an opening 13a through which the wafer W is loaded into or unloaded from the processing chamber 10 is provided through a sidewall of the processing chamber 10. A gate valve 13 that can be opened and closed is provided at the opening 13a.

A multiple number of gas injection holes 22 communicating with a gas supply path 21, e.g., a pipeline via a buffer room 21a are formed on a bottom surface of the upper electrode 2. A processing gas is injected toward the wafer W mounted on the mounting table 3 through the gas injection holes 22. A base end of the gas supply path 21 is connected to a gas supply system 23. The gas supply system 23 includes a processing gas supply source for forming various kinds of films on a surface of a focus ring 4 to be described later; and a processing gas supply source for performing an etching process on the wafer W. The processing gases supplied from the respective gas supply sources will be described later in detail. The gas supply system 23 includes a gas supply control device such as a valve or a flow rate controller and is configured to supply the processing gases into the processing chamber 10.

Further, the upper electrode 2 is connected with a high frequency power supply 26 for supplying a high frequency power to the upper electrode 2 via a matching unit (MU) 25. The upper electrode 2 is electrically isolated from the sidewall of the processing chamber 10 by an insulating member 27.

The mounting table 3 includes a main body 30 made of a conductive material such as aluminum; and an electrostatic chuck 31 provided on the main body 30. The electrostatic chuck 31 has therein an electrode 31a of, e.g., a foil shape. A DC power supply 33 is connected to the electrode 31a via a switch 32. As a DC voltage (chuck voltage) is applied to the electrode 31a, the wafer W is attracted to and held on a surface of the electrostatic chuck 31 by an electrostatic force. A temperature control mechanism (not shown) for performing a temperature control is provided within the main body 30. The wafer W is maintained at a preset temperature by the temperature control operation of the temperature control mechanism and heat from the plasma.

Further, formed in the surface of the electrostatic chuck 31 is a plurality of gas supply holes 34 through which a heat transfer gas, e.g., a helium gas for improving heat transfer efficiency in a gap between the mounting table 3 and the wafer W is injected toward a rear surface of the wafer W and diffused from the center to the outside. The gas supply holes 34 communicate with a heat transfer gas supply source 36 via a heat transfer gas supply path 35 formed to pass through the mounting table 3. The mounting table 3 is connected with a high frequency power supply 38 configured to apply a high frequency bias power to the mounting table 3 via a matching unit 37. Further, elevation pins (not shown) for loading and unloading the wafer W onto/from a transfer arm (not shown) is provided within the mounting table 3.

A focus ring 4 made of Si is provided around the electrostatic chuck 31 such that the focus ring 4 surrounds the wafer W attracted and held on the electrostatic chuck 31. An insulating protection ring 39 for protecting, e.g., screws of an assembly is provided on a top portion of the main body 30 of the mounting table 3. The focus ring 4 is placed on the protection ring 39 and a part of the main body 30. A stepped portion is formed at an inner periphery of the focus ring to receive thereon an edge portion of the wafer that is protruded to farther outside of the electrostatic chuck 31.

A protection case 51 made of, e.g., quartz and called as a deposition shield or the like is provided on an inner wall of the processing chamber 10 in order to prevent a reaction product from adhering to an inner wall surface of the processing chamber. Further, a cover 52 for preventing adhesion of a reaction byproduct is also provided on a side surface of the mounting table 3. A baffle plate 53 is provided to promote a uniform vacuum evacuation. Further, magnet units 54 and 55, each including a multiple number of permanent magnets arranged in a ring shape, are placed vertically at the outside of the processing chamber 2 so as to form a magnetic field in a processing atmosphere.

The plasma etching apparatus 1 includes a controller 50 for controlling an operation of each component thereof. The controller 50 includes a computer having, e.g., a non-illustrated CPU and a program. The program includes combinations of step (command) sets regarding the control of operations necessary for performing the etching process on the wafer W by the plasma etching apparatus 1, such as a supply of each gas from the gas supply system 23, a supply of a power from each of the high frequency power supplies 26 and 38, and so forth. The program is stored in a storage medium such as a hard disk, a compact disk, a magneto-optical disk or a memory card and is installed in the computer.

An operation of the plasma etching apparatus 1 will now be described. Here, for example, the plasma etching apparatus 1 performs a process in which a wafer W having a silicon film formed thereon is loaded and etched, and after the silicon film is etched, a wafer W having, e.g., an organic film formed thereon is loaded and etched. For the sake of convenience in description, the wafer W having the silicon film to be etched is referred to as a wafer W1, and the wafer W having the organic film to be etched is referred to as a wafer W2.

Figure 2A:
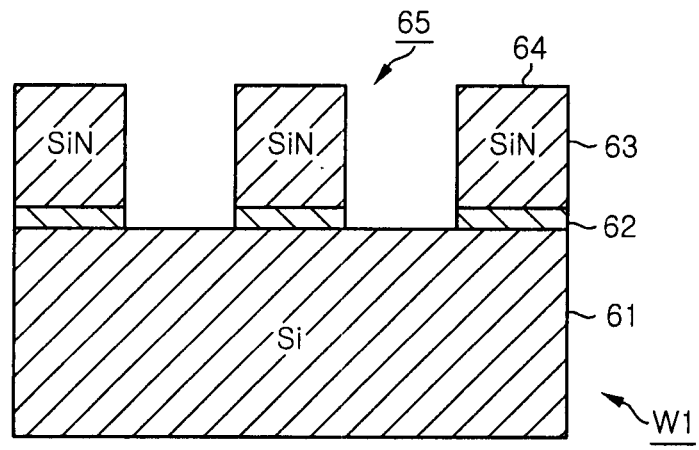
FIGS. 2A and 2B are longitudinal cross sectional views of a wafer surface etched with the plasma etching apparatus.
Figure 2B:
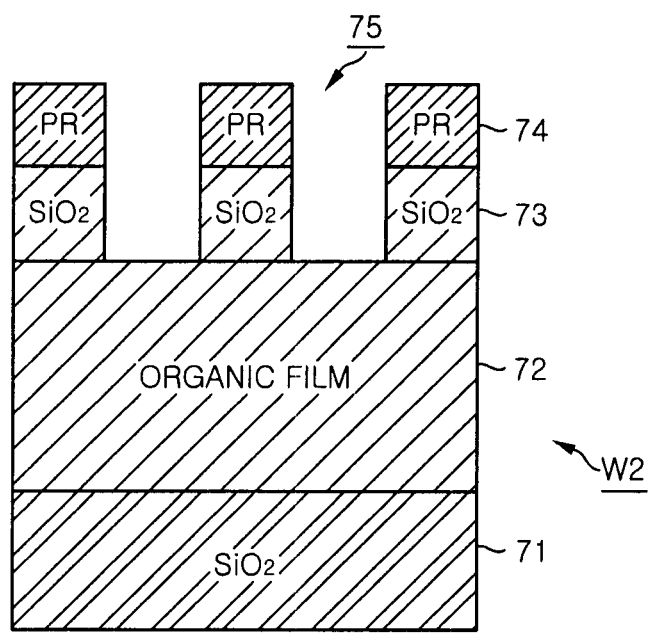

FIGS. 2A and 2B illustrate longitudinal cross sectional views of surfaces of the wafers W1 and W2, respectively. On the surface of the wafer W1, a silicon film 61, a silicon oxide film 62 and a SiN (silicon nitride) film 63 are formed in that order from the bottom. Protrusions 64 and groove-shaped openings 65 are formed in the silicon oxide film 62 and the SiN film 63. In the plasma etching apparatus 1, the silicon film 61 is etched by using the silicon oxide film 62 and the SiN film 63 as a hard mask, thereby forming a pattern for burying therein an oxide film for device isolation.

On the surface of the wafer W2, a $SiO_2$ film 71, an organic film 72 including carbon, a $SiO_2$ film 73 and a photoresist film (PR) 74 including carbon are formed on top of one another in that order from the bottom. The photoresist film 74 is provided with a pattern 75, and the $SiO_2$ film is etched based on the pattern 75. In the plasma etching apparatus 1, the organic film 72 and the photoresist film 74 are etched (ashed), thus forming a mask pattern in the organic film 72. This mask pattern is used to etch the $SiO_2$ film 71 and form a contact hole or the like.

Figure 4A:
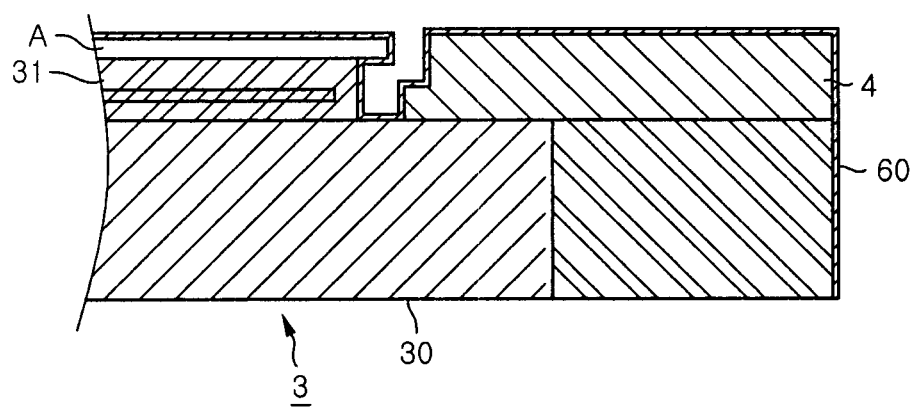
FIGS. 4A and 4B shows a process sequence in the plasma etching apparatus.
Figure 4B:
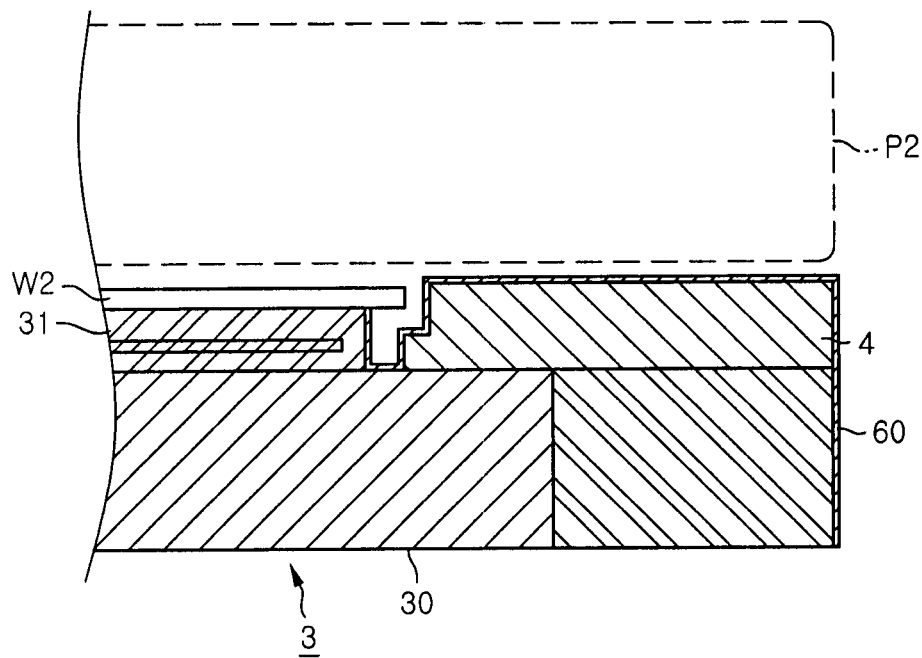
Figure 5A:
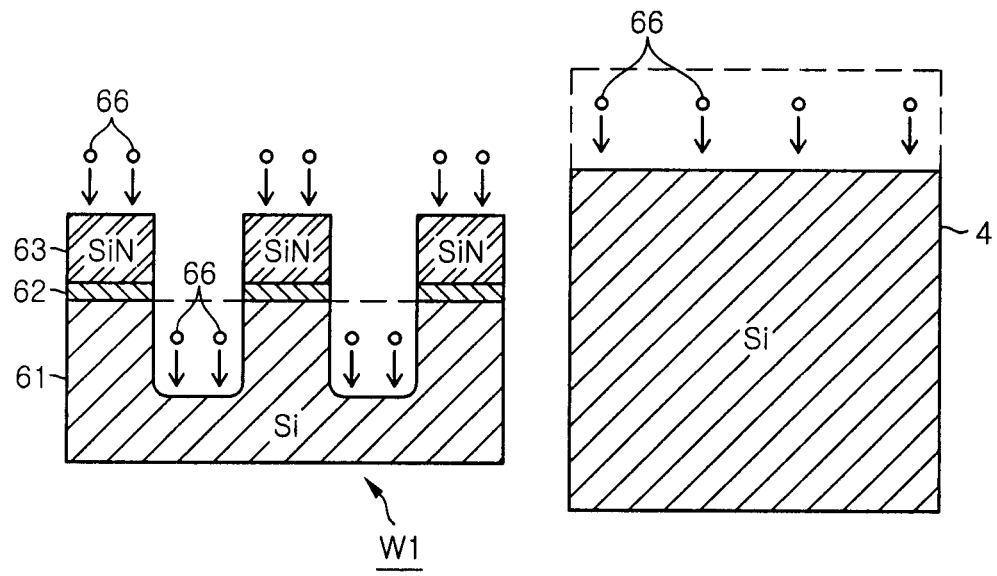
FIGS. 5A and 5B are views for explaining a state in which a wafer W and a focus ring are etched.
Figure 5B:
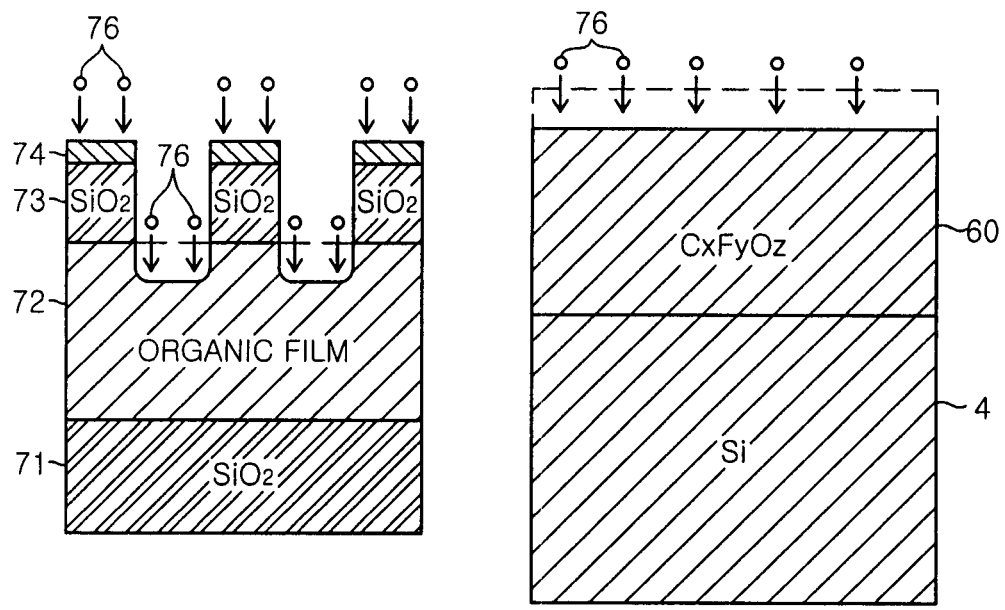

FIGS. 3A to 4B show a sequence of how surfaces of the mounting table 3 and the focus ring 4 are changed. FIGS. 5A and 5B show how the wafers W1 and W2 and the focus ring 4 are etched by using the plasma. In the following description, FIGS. 3A to 5B will be referred to appropriately.

First, the gate valve 13 shown in FIG. 1 is opened, and the wafer W1 is loaded into the processing chamber 10 by using a transfer arm (not shown). Then, by vertically moving the elevation pins (not shown), the wafer W1 is mounted on the surface of the mounting table 3. The wafer W1 is attracted to and held or the electrostatic chuck 31 by applying a voltage to the electrostatic chuck 31, and then a He gas as a heat transfer gas is supplied to the rear surface of the wafer W1.

Figure 3A:
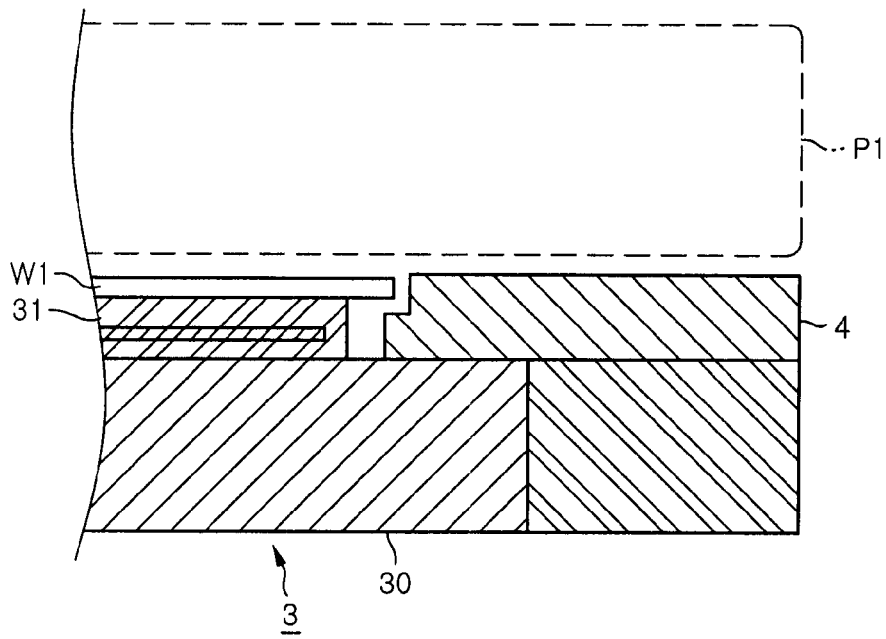
FIGS. 3A and 3B show a process sequence in the plasma etching apparatus.

Subsequently, the gate valve 13 is closed. Then, while maintaining the inside of the processing chamber 10 at a specified pressure level, processing gases for etching, for example, a $CF_4$ gas, a CO gas, an $O_2$ gas and an Ar gas, are supplied into the processing chamber 10. Each of the processing gases supplied into the processing chamber 10 flows radially outward on the surface of the wafer W and is exhausted from the vicinity of the mounting table 3. Thereafter, the high frequency power supply 26 is turned on to apply a high frequency voltage to a space between the upper electrode 2 and the mounting table 3 serving as the lower electrode. Therefore, a plasma converted from the respective processing gases are generated (FIG. 3A). Further, when the high frequency power supply 38 is turned on and a bias voltage is applied to the wafer W1, active species 66 in the generated plasma P1 collide against the wafer W1 vertically (FIG. 5A).

Here, the surface of the focus ring 4 around the wafer W1 and the etching target film 61 exposed on the surface of the wafer W1 are both made of Si. Accordingly, as shown in FIG. 5A, the surface of the focus ring 4 as well as the surface of the wafer W1 is etched by the active species 66 of the plasma P1. Consequently, an unbalanced distribution of the active species 66 near the boundary between focus ring 4 and the wafer W1 can be suppressed, unlike in the conventional cases as aforementioned in the background of the invention. Accordingly, the silicon film 61 can be highly uniformly etched by the active species 66 over the entire surface of the wafer W1.

When the high frequency power supplies 26 and 38 are turned off and the supply of the etching gases is stopped, the gate valve 13 is opened. Thereafter, the transfer arm is advanced into the processing chamber 10 and the wafer W1 is loaded onto the transfer arm with the elevation pins. The transfer arm is then withdrawn out of the processing chamber 10 while carrying the wafer W1 thereon. Then, a dummy wafer A for protecting the mounting table 3 during a film forming process is mounted on the mounting table 3 by the transfer arm. Thereafter, the gate valve 13 is closed, and while maintaining the inside of the processing chamber 10 at a specified pressure of, e.g., about 50 mTorr, an Ar gas, a CxHy gas (x and y being natural numbers) and an $O_2$ gas are supplied into the processing chamber 10 as processing gases for a film formation (film forming gases).

Figure 3B:
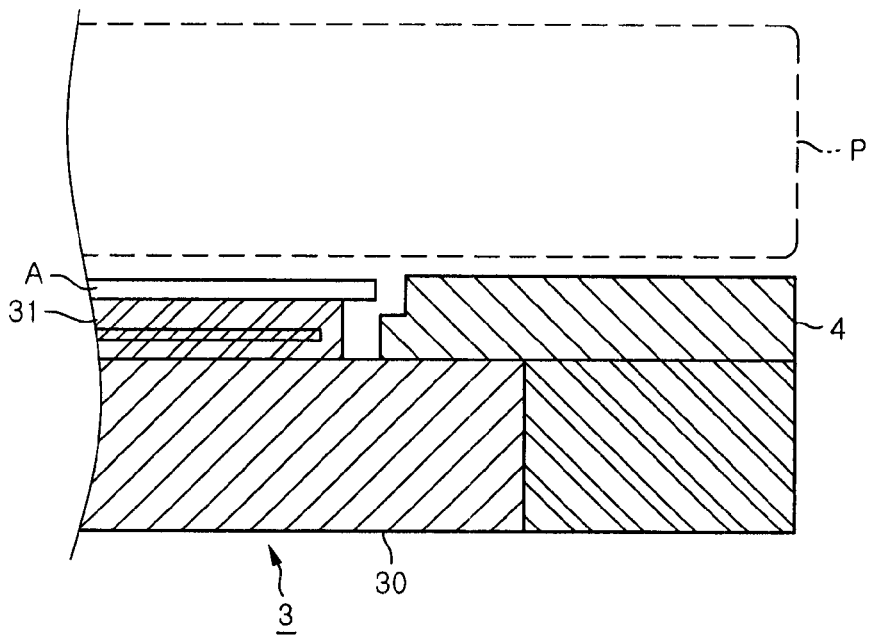

Subsequently, the high frequency power supply 26 is turned on and a high frequency power of, e.g., 1000 W is applied to the upper electrode 2, thus exciting plasma therein (FIG. 3B). Further, the high frequency power supply 38 is also turned on and a bias voltage is applied to the mounting table 3. Active species in the plasma P are deposited on the focus ring 4 disposed on the mounting table 3, and the dummy wafer A and the focus ring 4 are covered with an organic film (CxHyOz) (x, y and z being natural numbers) 60, as shown in FIG. 4A.

With a lapse of, e.g., 180 seconds after each of the high frequency power supplies 26 and 38 is turned on, each of the high frequency power supplies 26 and 38 is turned off and the supply of the Ar gas, the CxHy gas (x and y being natural numbers) and the $O_2$ gas is stopped. Then, the dummy wafer A is unloaded from the processing chamber 10 in the same manner as the wafer W1 is unloaded. Then, the wafer W2 is loaded into the processing chamber 10 in the same manner as the wafer W1 is loaded and is mounted on the mounting table 3. Subsequently, an Ar gas, an $O_2$ gas and a CO gas, for example, are supplied into the processing chamber 10 as processing gases for etching, and a plasma of these processing gases are generated through the same process as in the case of processing the wafer W1.

Here, the surface of the focus ring 4 and the etching target films 72 and 74 exposed on the surface of the wafer W2 are made of a same material including carbon. Accordingly, O radicals 76 that are active species of the generated plasma P2 etches the organic film 60 formed on the surface of the focus ring 4 as well as the photoresist film and the organic film 72 that are the etching target films of the wafer W. As a result, an unbalanced distribution of the O radicals 76 near the boundary between the focus ring 4 and the wafer W2 can be suppressed. Thus, the organic film 72 and the photoresist film 74 are highly uniformly etched by the O radicals 76 over the entire surface of the wafer W2 (FIG. 5B). Thereafter, the high frequency power supplies 26 and 38 are turned off and the supply of the etching gases is stopped. Then, the wafer W2 is unloaded from the processing chamber 10 in the same manner as the wafer W1 is unloaded.

In the event of processing an additional wafer W (referred to as a wafer W3 for the sake of convenience in description) after processing the wafer W2 is completed, a processing gas for film formation, which is selected depending on the kind of an etching target film of the wafer W3, is supplied before the wafer W3 is loaded into the processing chamber 10. Then, as in the case of processing the wafer W2, a plasma of the processing gas is generated and a film formation is performed on the surface of the focus ring 4. A main component of a film formed on the surface of the focus ring 4 is the same as a main component of the etching target film. Thereafter, the wafer W3 is loaded into the processing chamber 10, and a plasma etching process is performed on the wafer W3 in the same way as the wafer W2 is processed.

Now, in order to obtain the aforementioned fine distribution of plasma active species, a material for the film formed on the surface of the focus ring 4 will be described for each kind of an etching target film of the wafer W to be processed. Examples of etching gases for etching the etching target film will be also provided. Further, in FIG. 1, although illustration of a part of gases is omitted, the gas supply system 23 includes all kinds of gases described as a processing gas for film formation (film forming gas) and a processing gas for etching (etching gas) in respective cases to be described below. The gas supply system 23 is thus capable of supplying the etching gas and the film forming gas into the processing chamber 10 depending on the kind of the etching target film of the wafer W.

Case A in which the etching target film is an organic film:

Here, the term "organic film" refers to a film containing carbon as a main component and other elements such as hydrogen, oxygen and fluorine as secondary components. A film formed on the focus ring 4 may be an organic film containing carbon as a main component, similar to the etching target film. Further, besides the CxHyOz film mentioned in the above example, a CxHy film may be formed on the focus ring 4. In order to form the CxHy film, a gaseous mixture including a $CH_4$ gas and an $H_2$ gas or a gaseous mixture including a $C_2H_2$ gas and an $H_2$ gas is supplied. Further, in order to form the CxHyOz film, a gaseous mixture including a $CH_4$ gas, an $H_2$ gas and an $O_2$ gas may be supplied or a gaseous mixture containing a $CH_4$ gas and an $H_2O$ may be supplied. In this case A, an oxygen-based gas including oxygen is used as an etching gas.

Case B in which the etching target film is a Si film:

In this case, as in the aforementioned example, the surface of the focus ring 4 is made of Si. Accordingly, as stated above, for example, the focus ring 4 is exposed in a state where no film is formed thereon. Alternatively, a film made of a material having Si as a main component and N as a secondary component, e.g., a SiN film may be formed on the focus ring 4. In this case B, a fluorocarbon (CF)-based gas is used as an etching gas, for example.

Case C in which the etching target film is a $SiO_2$ film:

A film formed on the focus ring 4 is made of, e.g., $SiO_2$. In order to form the $SiO_2$ film, TEOS (tetraethoxysilane) is supplied. Alternatively, as in the case B, the surface of the focus ring 4 may be made of Si in the case C, and, accordingly, the focus ring 4 exposed in a state where no film is formed thereon may be used as in the case of etching the Si film 61 of the wafer W1. Further alternatively, a film made of a material having Si as a main component and N as a secondary component, e.g., a SiN film may be formed on the focus ring 4. In this case C, the aforementioned CF-based gas is used as an etching gas, for example.

Case D in which the etching target film is a SiN film:

A film formed on the focus ring 4 is made of, e.g., SiN. In order to form the SiN film, a gaseous mixture including an HMDS (hexamethyldisilazane) gas and an $HN_3$ (hydrazoic acid) gas may be supplied, or a gaseous mixture including a $SiH_4$ (monosilane) gas and an $N_2$ (nitrogen) gas may be supplied. Further, it may be also possible to supply a gaseous mixture including an $SiH_4$ gas and an $NH_3$ (ammonia) gas. Alternatively, as in the cases B and C, the surface of the focus ring 4 may be made of Si, and, accordingly, as in the cases B and C, the focus ring 4 exposed in a state where no film is formed thereon may be used. Further alternatively, a film made of a material having Si as a main component and O as a secondary component, e.g., a $SiO_2$ film may be formed on the focus ring 4. In this case D, the aforementioned CF-based gas is used as an etching gas, for example.

Case E in which the etching target film is an Al (aluminum) film:

A film formed on the focus ring 4 is made of, e.g., Al. In order to form the Al film, a DMAH (dimethyl aluminum hydride) gas or a TMA (trimethylaluminum) gas is used. Alternatively, a film made of a material having Al as a main component and N as a secondary component, e.g., an AlN (aluminum nitride) film may be formed on the focus ring 4. In this case E, a Cl (chlorine)-based gas or a Br (bromine)-based gas is used as an etching gas.

Case F in which the etching target film is a Cu (copper) film:

A film formed on the focus ring 4 is made of, e.g., Cu. A Cl-based gas or a Br-based gas is used as an etching gas. In order to form the Cu film, a Cu(hfac)TMVS (hexafluoro-acetylacetonato copper(I) trimethyl-vinylsilane) gas is used. Alternatively, a film made of a material having Cu as a main component and O as a secondary component, e.g., a CuO (cupric oxide) film may be formed on the focus ring 4. In this case F, a Cl-based gas or a Br-based gas is used as an etching gas.

In accordance with the plasma etching apparatus 1 of the first embodiment, a film having the same main component as that of the etching target film of the wafer W can be formed on the surface of the focus ring 4. Accordingly, when the etching target film is etched, active species of plasma react with the surface of the focus ring 4 as well as the etching target film. As a result, unbalanced distribution of the active species between the central portion of the wafer W and the vicinity of the boundary between the wafer W and the focus ring 4 can be suppressed. Thus, a highly uniform etching process can be performed over the entire surface of the wafer W.

In this regard, although the focus ring 4 can be made of alumina or ceramics, the focus ring 4 may be better to be made of Si since Si has same electrical characteristics as those of the wafer W, as discussed in the background of the invention. By forming the focus ring with Si, an electric field around the wafer W can be controlled to be highly uniform, and unbalanced distribution of plasma can be prevented more securely.

(Second Embodiment)

In the first embodiment, the film forming process on the focus ring 4 and the plasma etching process on the wafer W are performed in the single processing chamber. However, these processes may be performed separately in different processing chambers. A configuration of a semiconductor manufacturing apparatus 8 that performs the film forming process and the etching process separately will be described with reference to FIG. 6. The semiconductor manufacturing apparatus 8 includes a first transfer chamber 81 configured as a loader module for performing loading and unloading of a wafer W as a substrate for use in the manufacture of a semiconductor device; load lock chambers 82 and 83; and a second transfer chamber 84 configured as a vacuum transfer chamber. Mounting units 85 are provided on the front side of the first transfer chamber 81. A carrier C for accommodating therein a multiple number of wafers W is mounted on each mounting unit 85.

Gate doors GT respectively coupled to the carriers C and opened and closed together with covers of the carriers C are provided at a front wall of the first transfer chamber 81. The second transfer chamber 84 is airtightly connected to plasma etching modules 91, a focus ring film forming module 92 and a focus ring standby module 93.

An alignment chamber 94 for adjusting an orientation of a wafer W is provided at a lateral side of the first transfer chamber 81. Each of the load lock chambers 82 and 83 includes a vacuum pump and a leak valve (both are not shown), and an inner atmosphere of each load lock chamber can be switched between an atmospheric atmosphere and a vacuum atmosphere. That is, since the inside of the first transfer chamber 81 is maintained under the atmospheric atmosphere and the inside of the second transfer chamber 84 under the vacuum atmosphere, the load lock chambers 82 and 83 switch the inner atmosphere thereof when the wafer W is transferred between the first and the second transfer chamber.

Figure 6:
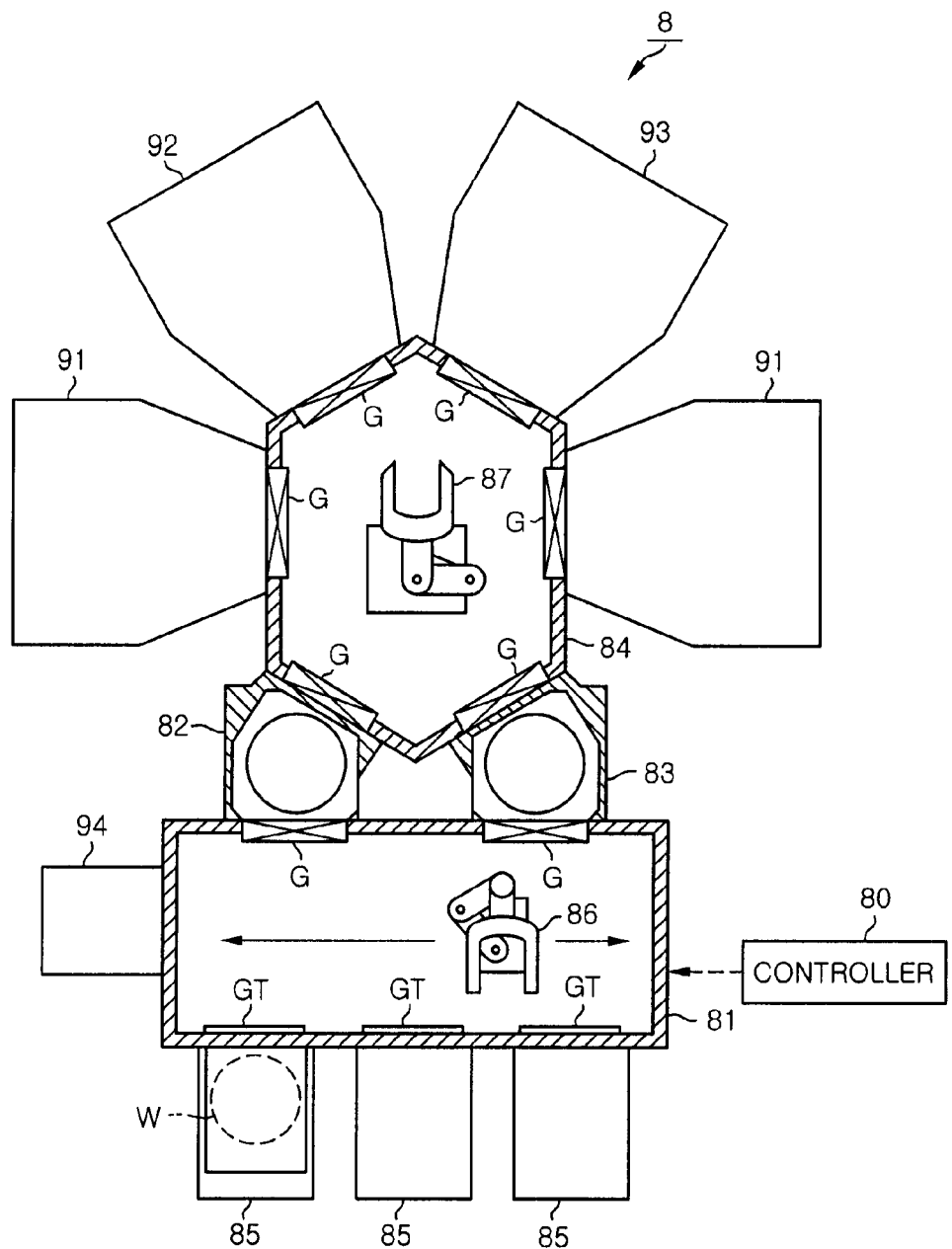
FIG. 6 is a plane view of a semiconductor manufacturing apparatus in accordance with another embodiment of the present invention.

In FIG. 6, 'G' denotes gate valves (sluice valves) for blocking communications between the load lock chambers 82 and 83 and the first or the second transfer chamber 81 or 84, or blocking communications between the second transfer chamber 83 and respective modules 91 to 93. Usually, the gate valves G are kept closed, and they are opened when the wafer W is transferred between the load lock chambers and the first or the second transfer chamber or between each module and the second transfer chamber 84.

The first transfer chamber 81 has therein a first transfer device 86, and the second transfer chamber 84 has therein a second transfer device 87. The first transfer device 86 is a multi-joint transfer arm, which serves to load and unload the wafer W between the carrier C and the load lock chamber 82 or 83 and between the first transfer chamber 81 and the alignment chamber 94. The second transfer device 87 is also a multi-joint transfer arm, which serves to load and unload the focus ring 4 from one module to another module as well as to load and unload the wafer W between the load lock chamber 82 or 83 and each module.

The semiconductor manufacturing apparatus 8 includes a controller 80 having a same configuration as that of the aforementioned controller 50. The controller 80 controls an operation of each component of the semiconductor manufacturing apparatus 8 so as to perform the transfer of the focus ring 4 as well as to perform the transfer of the wafer and the plasma etching process of the wafer W.

In this semiconductor manufacturing apparatus 8, the wafer W is transferred from the carrier C to the first transfer chamber 81, the alignment chamber 94, the first transfer chamber 81, the load lock chamber 82, the second transfer chamber 84 and the plasma etching module 91 in sequence, and then a plasma etching process is performed on the wafer W. Thereafter, the wafer W is transferred from the plasma etching module 91 to the second transfer chamber 84, the load lock chamber 83 and the first transfer chamber 81 in sequence and then returned back into the carrier C.

Now, the plasma etching module 91 will be elaborated. Since the basic configuration of the plasma etching module 91 is substantially the same as that of the plasma etching apparatus 1, only distinctive parts will be described in the following with reference to FIG. 7. A ring-shaped electrostatic chuck 101 is provided at a main body 30 of a mounting table 3 within the plasma etching module 91. The electrostatic chuck 101 has therein, e.g., an electrode 102, and a DC power supply 104 is connected to the electrode 102 via a switch 103. By applying a DC voltage (chuck voltage) to the electrode 102, a focus ring 4 is attracted to and held on the surface of the electrostatic chuck 101 by an electrostatic force.

Figure 7:
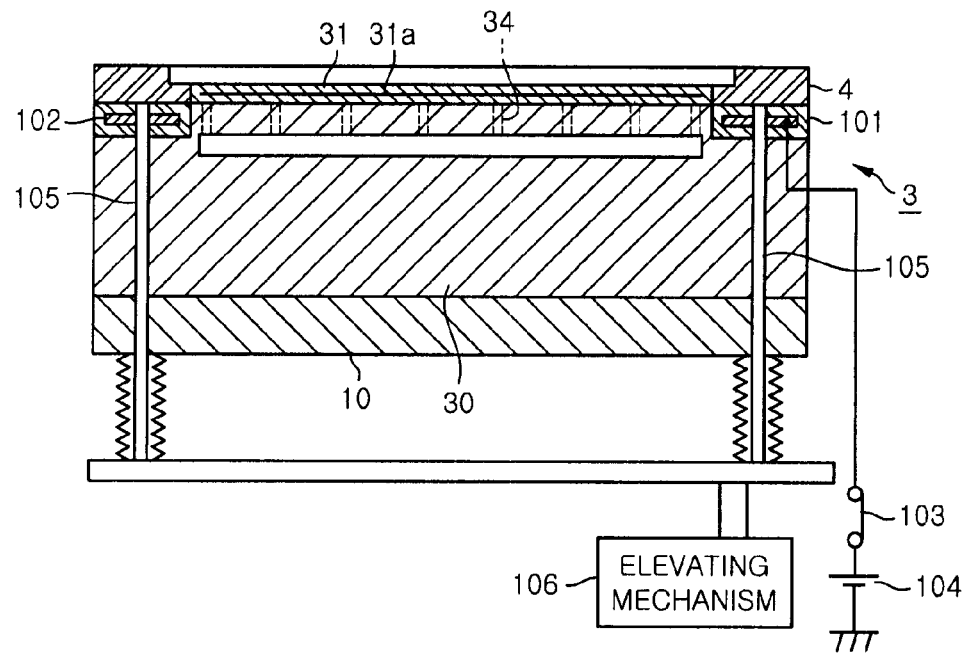
FIG. 7 is a longitudinal cross sectional view of a mounting table provided in the semiconductor manufacturing apparatus.
Figure 8:
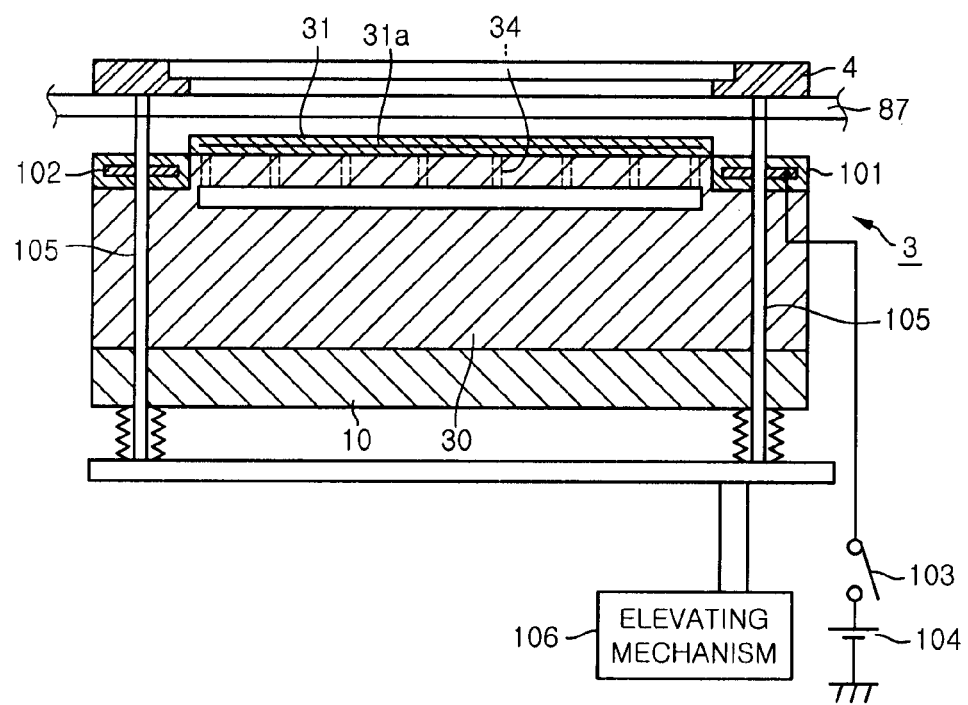
FIG. 8 is a view for explaining a state in which a wafer is loaded and unloaded between the mounting table and a transfer device.

Further, for example, three elevating pins 105 (only two are shown in FIG. 7) are formed so as to pass through the electrostatic chuck 101 in a thickness direction. The elevating pins 105 are protruded above the surface of the electrostatic chuck 101 by an elevating mechanism 106. After the switch 103 is turned off and the electrostatic force by the electrostatic chuck 101 disappears, the elevating pins 105 are moved upward so as to lift the focus ring 4, as shown in FIG. 8. The second transfer device 87 receives the lifted focus ring 4 and transfers the focus ring 4 to another module.

Similar to the plasma etching apparatus 1, the plasma etching module 91 includes a gas supply system for supplying various kinds of etching gases into a processing chamber 10. Thus, as in the first embodiment, a plasma etching process can be performed on the wafer W.

The focus ring film forming module 92 has the same configuration as that of the plasma etching module 91, and a focus ring 4 is detachably fastened to a mounting table 3. Further, similar to the plasma etching apparatus 1, the focus ring film forming module 92 includes a gas supply system for supplying various film forming gases into a processing chamber 10. As in the first embodiment, with the focus ring 4 attracted to and held on an electrostatic chuck 101 of the mounting table 3, a film forming gas is supplied, and a plasma of the film forming gas is generated, so that a film forming process is performed on the focus ring 4.

Figure 9:
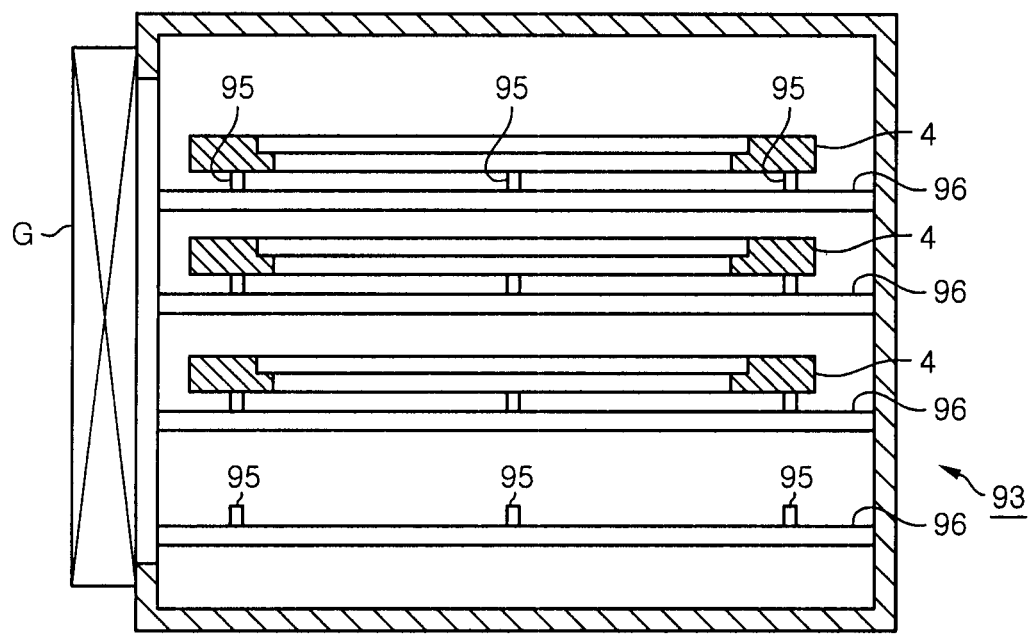
FIG. 9 is a longitudinal cross sectional view of a focus ring standby module provided in the semiconductor manufacturing apparatus.

FIG. 9 is a longitudinal cross sectional view of the focus ring standby module 93. In this focus ring standby module 93, a multiple number of shelves 96 for mounting thereon focus rings 4 are provided. Each shelf 96 is provided with, e.g., three supporting pins 95 for supporting a focus ring 4 thereon. As the second transfer device 87 that has entered the focus ring standby module 93 is moved up and down, the focus ring 4 is transferred between the supporting pins 95 on the shelf 96 and the second transfer device 87.

For example, a shelf 96 for mounting a focus ring 4 thereon is determined in advance depending on the kind of a film to be formed on the focus ring 4. Various kinds of films are previously formed on focus rings 4, and each focus ring 4 is mounted on the corresponding shelf 96 depending on the film formed thereon and kept in a standby mode. Then, before a wafer W is loaded into the second transfer chamber 84, the focus ring 4 having thereon a film corresponding to an etching target film of the wafer W is taken out of the focus ring standby module 93 by the second transfer device 87. Thereafter, the second transfer device 87 transfers the focus ring 4 into the plasma etching module 91, and the focus ring 4 is fastened to the mounting table 3.

If the lot of wafers W loaded into the semiconductor manufacturing apparatus 8 is changed and the material of the etching target film is changed, the focus ring 4 of the plasma etching module 91 is transferred from the mounting table 3 back into the corresponding shelf 96 by the second transfer device 87. Then, depending on the kind of an etching target film of a next wafer W, the second transfer device 87 transfers a different focus ring 4 from a corresponding shelf 96 onto the mounting table 3, and the different focus ring 4 is fastened to the mounting table 3.

In this second embodiment, a film having the same main component as that of the etching target film of the wafer W is formed on the focus ring 4. Thus, as in the first embodiment, a highly uniform etching process can be performed on the wafer W.

Figure 10A:
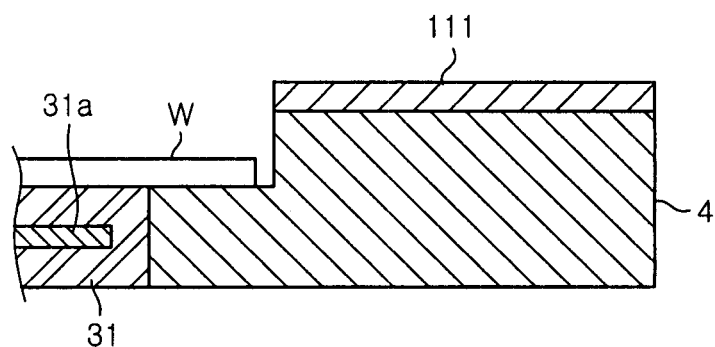
FIGS. 10A and 10B provide longitudinal cross sectional views illustrating other configuration examples of the focus ring.

In the above-described first and second embodiments, instead of forming a film on the focus ring 4 by using a processing gas, a film 111 may be attached on the surface of the focus ring 4, as shown in FIG. 10A. The film 111 may be made of any one of various materials mentioned in the cases A to F depending on the kind of an etching target film. For example, when attaching such a film 111 instead of forming a $SiO_2$ film by using a processing gas, the film 111 may be made of, but not limited to, MSQ (methylsilsesquioxane). Further, when attaching the film 111 instead of forming a SiN film, the film 111 may be made of, but not limited to, HMDS. Further, when attaching the film 111 instead of forming a CHxOy film, the film 111 may be made of, but not limited to, PMMA (poly(methylmethacrylate) resin) or SILK (polyarylene hydrocarbon).

Figure 10B:
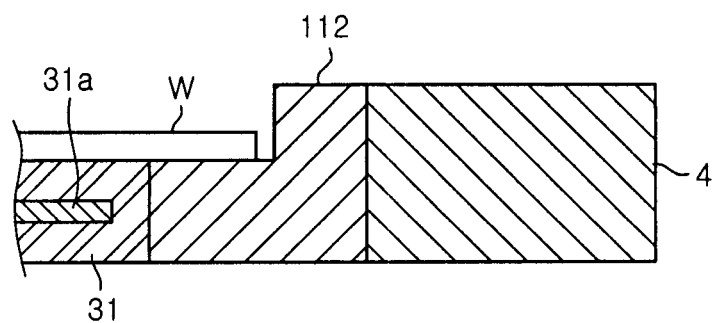

Alternatively, instead of forming a film on the focus ring 4, a ring member 112 made of a material having the same main component as that of an etching target film may be provided at inner side the focus ring 4, as shown in FIG. 10B. In this case, reaction of plasma active species at a circumferential edge portion of a wafer W is controlled by the ring member 112 and an electric field around the wafer W is controlled by the focus ring 4. Accordingly, the plasma active species can be uniformly distributed in the surface of the wafer W.

Although the embodiments have been described for the case of processing the wafer W, the present invention can also be applied to a case of processing a rectangular substrate such as a flat panel. That is, the ring member made of a material having the same main component as that of the etching target film may have a circular shape or a rectangular shape. Further, a member which is disposed to surround the substrate and on which a film is formed by applying various kinds of film forming gases or the film 111 may have a circular shape or a rectangular shape. Further, as stated above, in case of providing the ring member 112 as a separate member from the focus ring 4, the ring member 112 may also have a rectangular shape without being limited to a circular shape.

(Evaluation Test)

Now, experiments by simulation based on which the present invention has been studied will be explained. In this simulation, substantially the same apparatus as described in the first embodiment was used. A wafer W having an organic film of $(CH_2)_n$ as an etching target film was mounted on a mounting table 3 of this apparatus. The diameter of the wafer W was 300 mm. An $O_2$ gas, a CO gas and an Ar gas were supplied from an upper electrode 2 at flow rates of 60 sccm, 100 sccm and 450 sccm, respectively. A pressure in the processing chamber 10 to be obtained by evacuation was set to be, e.g., 2.0 Pa.

In view of the fact that O (oxygen) radicals make great contribution to the etching of the organic film, a concentration distribution and a flux of the O radicals in the processing chamber 10 were investigated while varying reactivity ($\gamma$) of a surface of a focus ring 4 against the O radicals. In addition, an in-plane etching rate of the wafer W was investigated for each reactivity ($\gamma$). If the value of the reactivity ($\gamma$) was 0, it indicated that the surface of the focus ring 4 and the O radicals did not react with each other at all. As the reactivity ($\gamma$) was close to the value of 1, the O radicals reacted with the surface of the focus ring 4 as well as the wafer W.

Figure 11A:
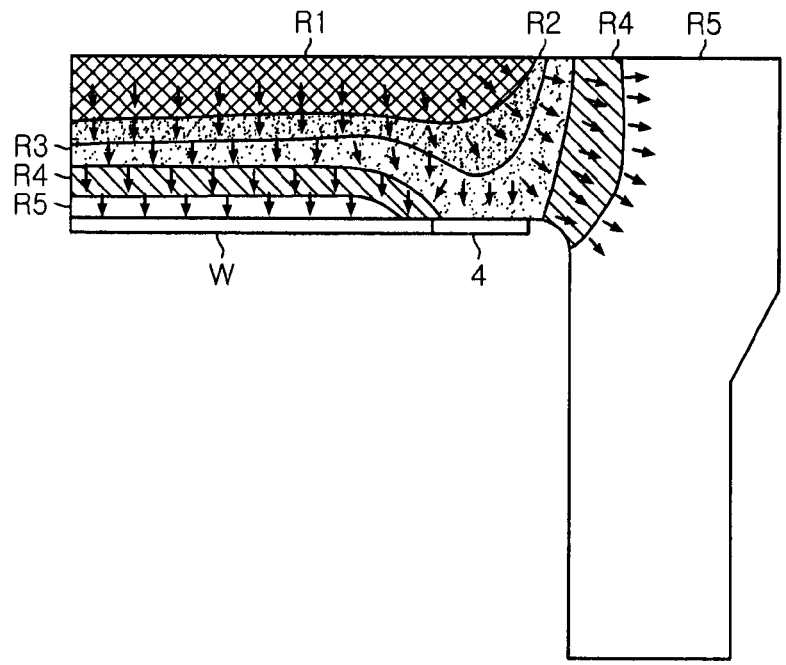
FIGS. 11A and 11B are views for explaining a simulation result.
Figure 11B:
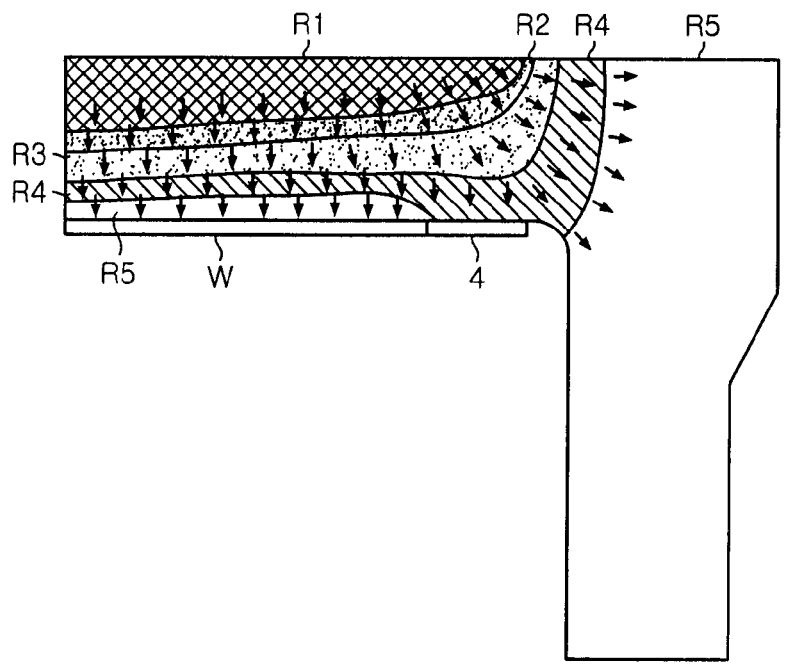

FIGS. 11A and 11B show distributions of O radicals indicated by concentration contours when the reactivities ($\gamma$) were 0 and 0.25, respectively. In each experiment, the radicals were distributed in the range, e.g., from $0.50 \times 10^{-5}$ mol/m$^3$ to $1.69 \times 10^{-5}$ mol/m$^3$. In FIGS. 11A and 11B, a range R1 in which the concentration of the O radicals was equal to or higher than $1.35 \times 10^{-5}$ mol/m$^3$ is indicated by a mesh pattern; a range R2 in which the concentration of the O radicals was lower than $1.35 \times 10^{-5}$ mol/m$^3$ and equal to or higher than $1.24 \times 10^{-5}$ mol/m$^3$ is indicated by a pattern of dots; and a range R3 in which the concentration of the O radicals was lower than $1.24 \times 10^{-5}$ mol/m$^3$ and equal to or higher than $1.02 \times 10^{-5}$ mol/m$^3$ is also indicated by a pattern of dots, but the range R3 had lower density than that in the range R2. A range R4 in which the concentration of the O radicals was lower than $1.02 \times 10^{-5}$ mol/m$^3$ and equal to or higher than $0.90 \times 10^{-5}$ mol/m$^3$ is indicated by dashed lines, and a range R5 in which the concentration of the O radicals was lower than $0.90 \times 10^{-5}$ mol/m$^3$ is assigned no line or dot.

Figure 12A:
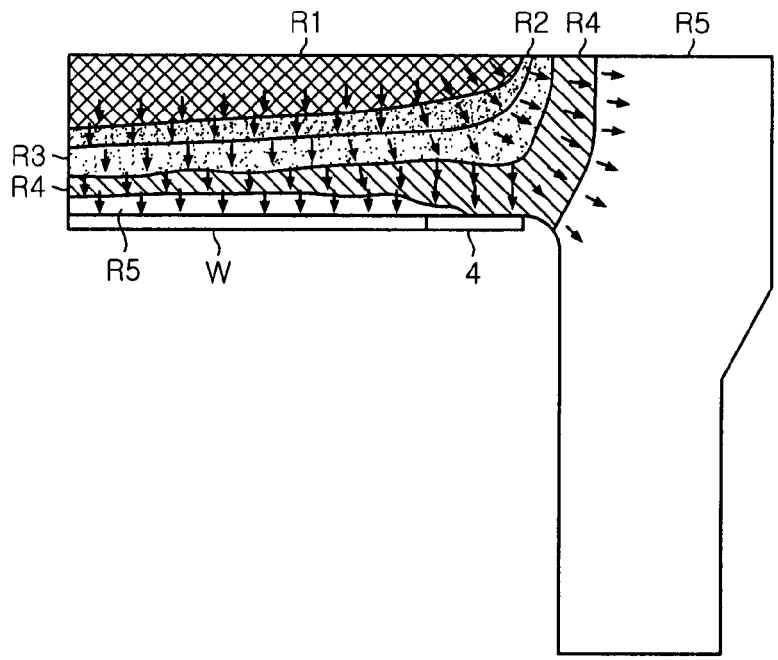
FIGS. 12A and 12B are views for explaining a simulation result.
Figure 12B:
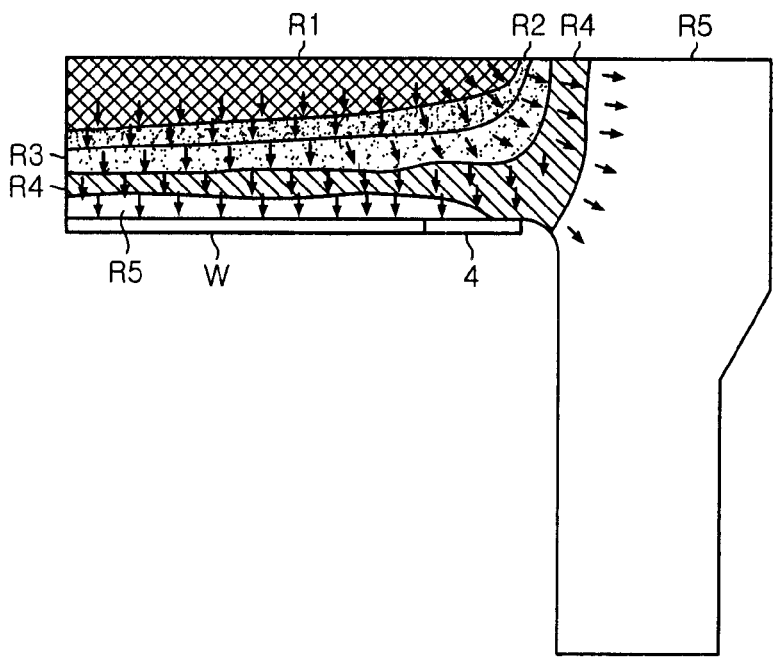

FIGS. 12A and 12B show concentration distributions of O radicals in the same manner as in FIGS. 11A and 11B when the reactivities ($\gamma$) were 0.5 and 1, respectively.

Figure 13A:
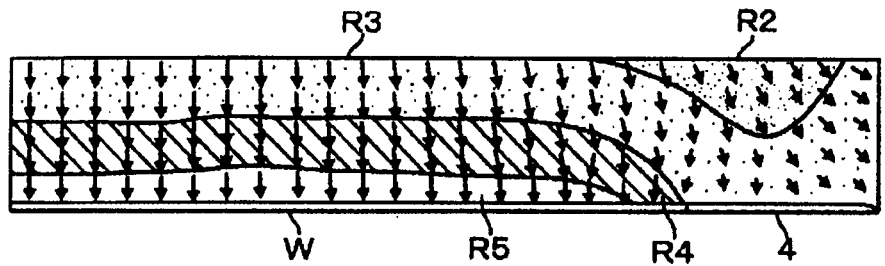
FIGS. 13A to 13C are views for explaining a simulation result.
Figure 13B:
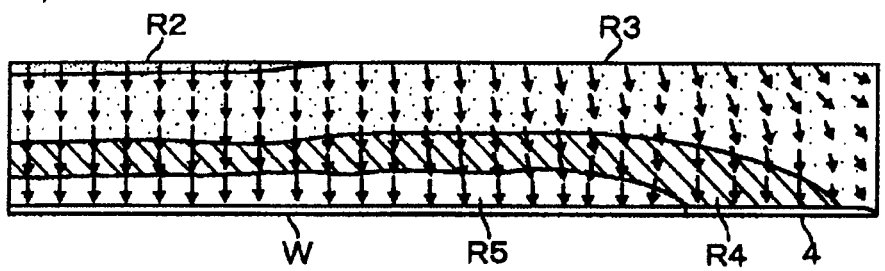
Figure 13C:
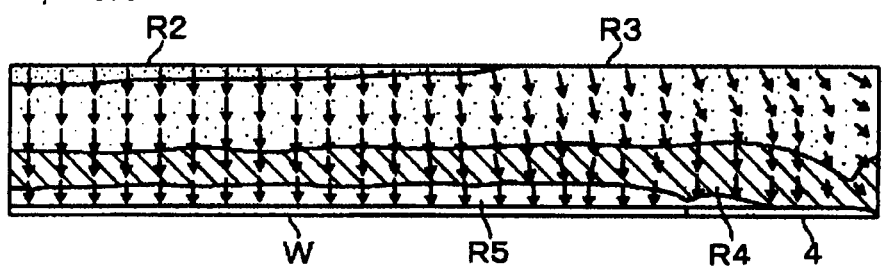

In this simulation, a flux at each position in the processing chamber was calculated. A flux is defined as an amount of the moving O radicals per a unit area and a unit time, and the unit of the flux is mol/m$^2$·sec. Calculated fluxes are indicated by arrows in FIGS. 11A to 12B, and directions of the arrows indicate flow directions of the O radicals. In FIGS. 11A to 12B, however, a smaller number of arrows are marked, as compared to an actual result of the simulation, for the simplicity of illustration. Arrows in the vicinity of the wafer W when the reactivities ($\gamma$) were 0, 0.25 and 0.5 are more clearly shown in FIGS. 13A to 13C, respectively. In FIGS. 13A to 13C, the length of an arrow indicates the magnitude of the flux of the O radicals at each position, and an arrow with a larger length indicates a larger amount of the moving O radicals.

As shown in FIGS. 11A to 13C, when the reactivity ($\gamma$) was 0, the O radicals reached an edge portion of the wafer W, and concentration distributions of the O radicals at a central portion and the edge portion of the wafer W were different. However, when the reactivities ($\gamma$) were 0.25, 0.5 and 1, the flow of the O radicals to the focus ring 4 increased while the flow of the O radicals to the edge portion of the wafer W was suppressed. Accordingly, uniformity of the concentration distributions of the O radicals at the central portion and the edge portion of the wafer W can be improved.

Figure 14:
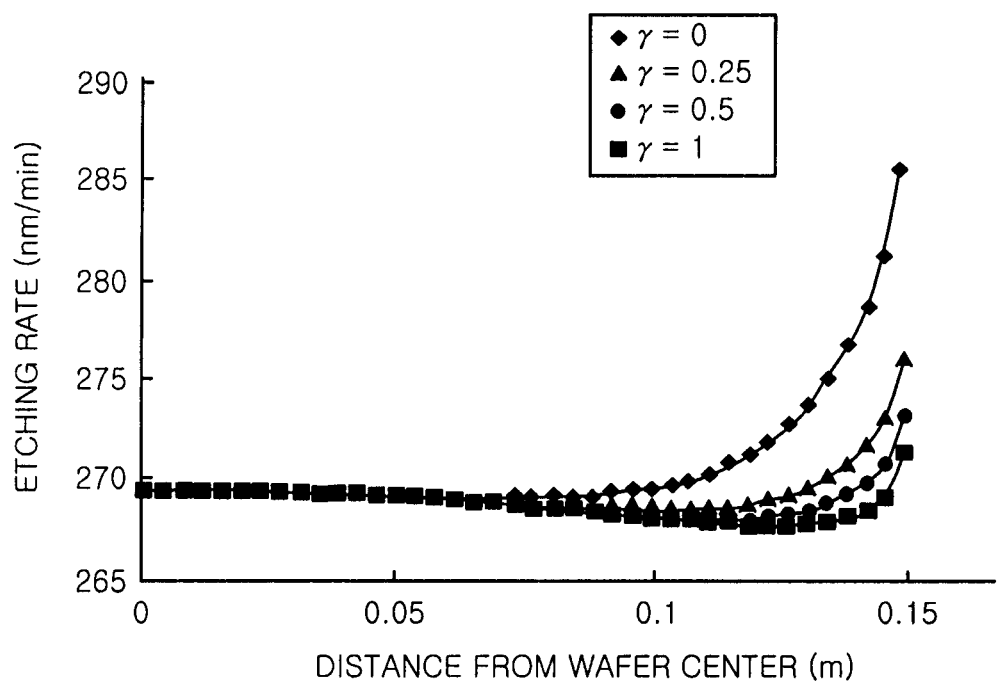
FIG. 14 is a view for explaining a simulation result.

FIG. 14 is a graph showing an etching rate of the wafer W for each reactivity ($\gamma$) obtained by the simulation. A vertical axis of the graph represents an etching rate (nm/min) and a horizontal axis thereof represents a distance from the center of the wafer W. As can be seen from this graph, uniformity of the in-plane etching rates of the wafer W increases as the reactivity by the O radicals on the focus ring 4 becomes closer to the reactivity by the O radicals on the wafer W. From the simulation results shown in FIGS. 11A to 14, the present inventor has reached to the idea that by disposing around the wafer W a ring member made of a material having the same main component as that of the etching target film, the uniformity of the in-plane etching rates of the wafer W can be improved.

What is claimed is:

1. A method of dry-etching an etching target film formed on a substrate, comprising:
   determining whether the etching target film is an organic film or a metal film;
   loading the substrate into a processing chamber and mounting the substrate on a mounting table provided in the processing chamber; such that a ring member is disposed to surround the substrate;
   depositing in-situ on the surface of the ring member an organic compound in a case where the etching target film is determined to be an organic film, and depositing in-situ on the surface of the ring member one of a metal, a metal nitride, and a metal oxide in a case where the etching target film is determined to be a metal film; and
   etching the etching target film by using a target gas in a state where the ring member is disposed to surround the substrate.

2. The etching method of claim 1, wherein a coating film is formed by said depositing on a base of the ring member, the base being made of a material having electrical characteristics close to those of the substrate, and wherein a main component of the etching target film is different from that of the substrate, and a main component of the coating film is different from that of the base.

3. The etching method of claim 1, wherein a coating film is formed by said depositing on a base of the ring member, the base being made of a material having electrical characteristics identical to those of the substrate, and wherein a main component of the etching target film is different from that of the substrate, and a main component of the coating film is different from that of the base.

4. The etching method of claim 1, wherein said etching the etching target film is carried out by using a plasma of the processing gas.

5. A method of dry-etching an etching target film formed on a substrate, comprising:
   determining a main component of the etching target film;
   forming, on a surface of a ring member configured to be used to surround the substrate when the substrate is mounted on a mounting table provided in a processing chamber to be etched therein, a film made of a material having a same main component determined as that of the etching target film formed on the substrate by supplying a film forming gas to the ring member;
   loading the substrate into the processing chamber and mounting the substrate on the mounting table;
   etching the etching target film by using a processing gas in a state where the ring member is disposed to surround the substrate; and
   when the main component of the etching target film is changed to a different main component, changing the film on the surface of the ring member to be made of the same different main component.

6. The etching method of claim 5, wherein the process of forming the film on the surface of the ring member is performed in the same processing chamber in which the etching is performed.

7. The etching method of claim 5, wherein the ring member is made of a material having electrical characteristics close to those of the substrate, and wherein the main component of the etching target film is different from that of the substrate, and the main component of the film formed on the ring member is different from that of the ring member.

8. The etching method of claim 5, wherein the ring member is made of a material having electrical characteristics identical to those of the substrate, and wherein the main component of the etching target film is different from that of the substrate, and the main component of the film formed on the ring member is different from that of the ring member.

9. The etching method of claim 5, wherein said etching the etching target film is carried out by using a plasma of the processing gas.

10. A dry-etching method comprising:
    determining that a main component of a previously etched target film on a substrate is different from that of a to-be-newly-etched target film formed on said substrate;
    replacing a ring member employed in etching the previously etched target film with a new ring member having a film formed on the new ring member, wherein the film made of a material having a same main component determined as that of the to-be-newly-etched target film is formed on a surface of the new ring member on said substrate by supplying a film forming gas to the new ring member;
    loading the substrate having the to-be-newly-etched target film into the processing chamber and mounting the substrate on the mounting table; and
    etching the to-be-newly-etched target film by using a processing gas in a state where the new ring member is disposed to surround the substrate.

11. The etching method of claim 10, wherein the new ring member is made of a material having electrical characteristics close to those of the substrate, and wherein the main component of the to-be-newly-etched target film is different from that of the substrate, and the main component of the film formed on the new ring member is different from that of the new ring member.

12. The etching method of claim 10, wherein the new ring member is made of a material having electrical characteristics identical to those of the substrate, and wherein the main component of the to-be-newly-etched target film is different from that of the substrate, and the main component of the film formed on the new ring member is different from that of the new ring member.

13. The etching method of claim 10, wherein the surface of the new ring member is made of an organic compound in a case where the to-be-newly-etched target film is an organic film and the surface of the new ring member is formed of one of a metal, a metal nitride, and a metal oxide in a case where the to-be-newly-etched target film is a metal film.

14. The etching method of claim 10, wherein said etching the etching target film is carried out by using a plasma of the processing gas.

* * * * *